United States Patent [19]

Sekiya et al.

[11] Patent Number: 4,475,180

[45] Date of Patent: Oct. 2, 1984

[54] NON-VOLATILE MEMORY CIRCUIT FOR PORTABLE ELECTRONIC DEVICES

[75] Inventors: Fukuo Sekiya; Itsunari Hayabuchi, both of Saitama, Japan

[73] Assignee: Citizen Watch Co., Ltd., Tokyo, Japan

[21] Appl. No.: 334,227

[22] Filed: Dec. 24, 1981

[30] Foreign Application Priority Data

Jan. 13, 1981 [JP] Japan .................................. 56-3494

[51] Int. Cl.³ ........................ G11C 13/00; G11C 7/00
[52] U.S. Cl. .................................... 365/228; 365/189; 368/156; 368/185; 368/186; 368/189
[58] Field of Search ............... 368/156, 185, 186, 189; 365/174, 182, 228, 189; 307/238.3

[56] References Cited

U.S. PATENT DOCUMENTS 4,348,729  9/1982  Sasayama et al. ............... 365/228 X
4,393,481  7/1983  Owen et al. ..................... 365/228

Primary Examiner—Robert L. Richardson
Attorney, Agent, or Firm—Bernard, Rothwell & Brown

[57] ABSTRACT

A writable non-volatile memory circuit for use in portable electronic devices such as electronic timepiece, wherein there is improved the power consumption and there is provided a volatile memory with a serial input for writing the data into the non-volatile memory and for checking the data.

18 Claims, 6 Drawing Figures

NON-VOLATILE MEMORY CIRCUIT FOR PORTABLE ELECTRONIC DEVICES

BACKGROUND OF THE INVENTION

1. Field of the Invention

The present invention relates to a writable non-volatile memory circuit for use in portable electronic devices such as electronic timepieces, and more specifically to the improvement in the number of terminals for writing the data into the non-volatile memory and for checking the data.

2. Description of the Prior Art

A masked ROM (read-only memory) has hitherto been employed for portable electronic devices such as electronic timepieces. The masked ROM is a memory device which is exclusively used for reading the data, and has hence presented no problem in regard to the number of terminals for writing the data.

However, if a writable memory is used for the electronic timepieces, it is possible to feed correction data required for the individual timepieces. Therefore, performance of the timepieces can be enhanced strikingly. With the writable non-volatile memories of the present time, a voltage of greater than 20 volts must be applied to write the data. The non-volatile memory circuits that are now generally used have been designed to work on a power-supply voltage of about 5 volts, and are capable of withstanding the writing voltage of greater than 20 volts.

Therefore, peripheral circuits of the non-volatile memory could be designed without requiring any particular attention for withstanding high tension, and a relatively small number of terminals were required for writing the data.

However, the circuit used for electronic timepieces has been designed to work on a power-supply voltage of about 1.5 volts, and is not capable of withstanding the writing voltage of greater than 20 volts. Therefore, if it is attempted to write the data in the same manner as with the conventional peripheral circuits, it is necessary to so design the whole peripheral circuit that it can withstand a particularly high voltage. This, however, presents problems with regard to the areas of LSI and the consumption of current. In order to avoid the problem of breakdown voltage, on the other hand, if the external terminals for applying the writing voltage are provided for every bit of the non-volatile memory, the number of terminals becomes too great.

Further, the conventional writable non-volatile memory circuit possessed address terminals for selecting the word and data terminals for one word to write or read the data. In the integrated circuits for electronic timepieces, however, it has been desired to eliminate even such terminals.

SUMMARY OF THE INVENTION

The present invention is to provide a writable non-volatile memory circuit suited for use in portable electronic devices such as electronic timepieces operated on a power-supply voltage of about 1.5 volts, eliminating the above-mentioned defects inherent in the conventional art.

According to the present invention, there is provided a writable non-volatile memory circuit used for portable electronic devices such as electronic timepieces, comprising a volatile memory which is capable of introducing the data in a serial manner and a non-volatile memory which is provided to correspond to each of the bits of said volatile memory and which receives the data of said volatile memory, wherein said volatile memory for introducing the data and said non-volatile memory are formed on the same semiconductor substrate.

PREFERRED EMBODIMENTS OF THE INVENTION

Figure 1:
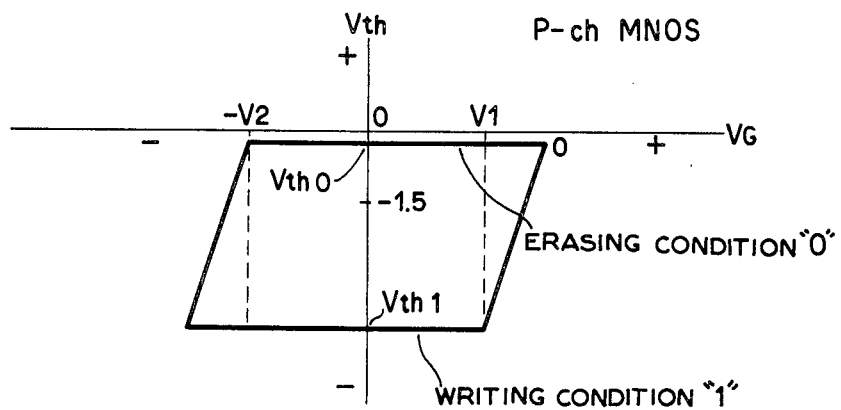
FIG. 1 is a graph showing the characteristics of a non-volatile memory according to an embodiment of the present invention.

FIG. 1 is a diagram illustrating the characteristics of a P-channel MNOS memory employed in the circuit according to an embodiment of the present invention. When a gate voltage in excess of $V_1$ is applied, the threshold voltage changes in the direction of depression to assume a value $V_{th0}$ and when a gate voltage of smaller than $-V_2$ is applied, the threshold voltage changes in the direction of enhancement to assume a value $V_{th1}$.

The threshold voltage is not changed by the gate voltage that lies between $V_1$ and $-V_2$.

The state in which the threshold voltage assumes the value $V_{th0}$ is defined as the erasing condition "0", and the state in which the threshold voltage assumes the value $V_{th1}$ is defined as the writing condition "1".

Figure 2:
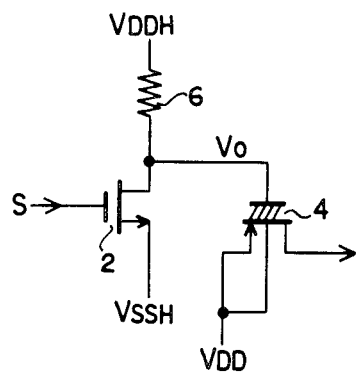
FIG. 2 is a diagram of a writing circuit of the present invention which exhibits the characteristics of FIG. 1.

FIG. 2 is a diagram illustrating a writing circuit in a non-volatile memory circuit according to the present invention.

The writing circuit of FIG. 2 consists of an inverter which is made up of an N-channel MOSFET 2 having a high breakdown voltage and a load resistor 6 and which is served with a high-potential power supply $V_{DDH}$, a low-potential power supply $V_{SSH}$ and a signal S as an input, and a P-channel MNOS memory unit 4 which is served with the output of the inverter through a gate thereof and which has a source electrode connected to $V_{DD}$.

The operation of the writing circuit of FIG. 2 is illustrated as shown in Table 1.

TABLE 1

| $V_{SSH}$ | $V_{DDH}$ | S | $V_0$ | |
|---|---|---|---|---|
| −25 V | 0 V | L: −1.5 V<br>H: 0 V | −25 V | write |
| −1.5 V | +25 V | L: −1.5 V<br>H: 0 V | +25 V<br>−1.5 V | erase<br>condition does not change |
| −1.5 V | −1.5 V | | −1.5 V | condition does not change |

($V_{DD} = 0$ V)

In the above Table 1, the signal S serves as a data to be written. The signal L(−1.5 V) is applied to erase the data in the memory, and the signal H(0 V) is applied to write the data.

The MNOS memory unit 4 enables the data to be written or erased when the gate voltage is greater than 20 volts. First, if $V_{SSH}$ is set to $-25$ V and $V_{DDH}$ to 0 V, the output voltage $V_0$ of the inverter assumes a value $-25$ V independently of the signal S. Therefore, the MNOS memory unit 4 assumes the writing condition. Then, if $V_{SSH}$ is set to $-1.5$ V and $V_{DDH}$ to $+25$ V, $V_0$ assumes the value $+25$ V when the signal S is of the low level, and the memory unit assumes the erasing condition. When the signal S is of the high level, $V_0$ assumes the value $-1.5$ V, and the previous condition is maintained, i.e., the writing condition is maintained, when $V_{SSH}$ is set to $-1.5$ V and $V_{DDH}$ is set to $+25$ V.

When $V_{DDH}$ and $V_{SSH}$ are both set to $-1.5$ V during normal operating conditions, the output voltage $V_0$ of the inverter assumes $-1.5$ V, and no change occurs in the threshold of unit 4.

Figure 3:
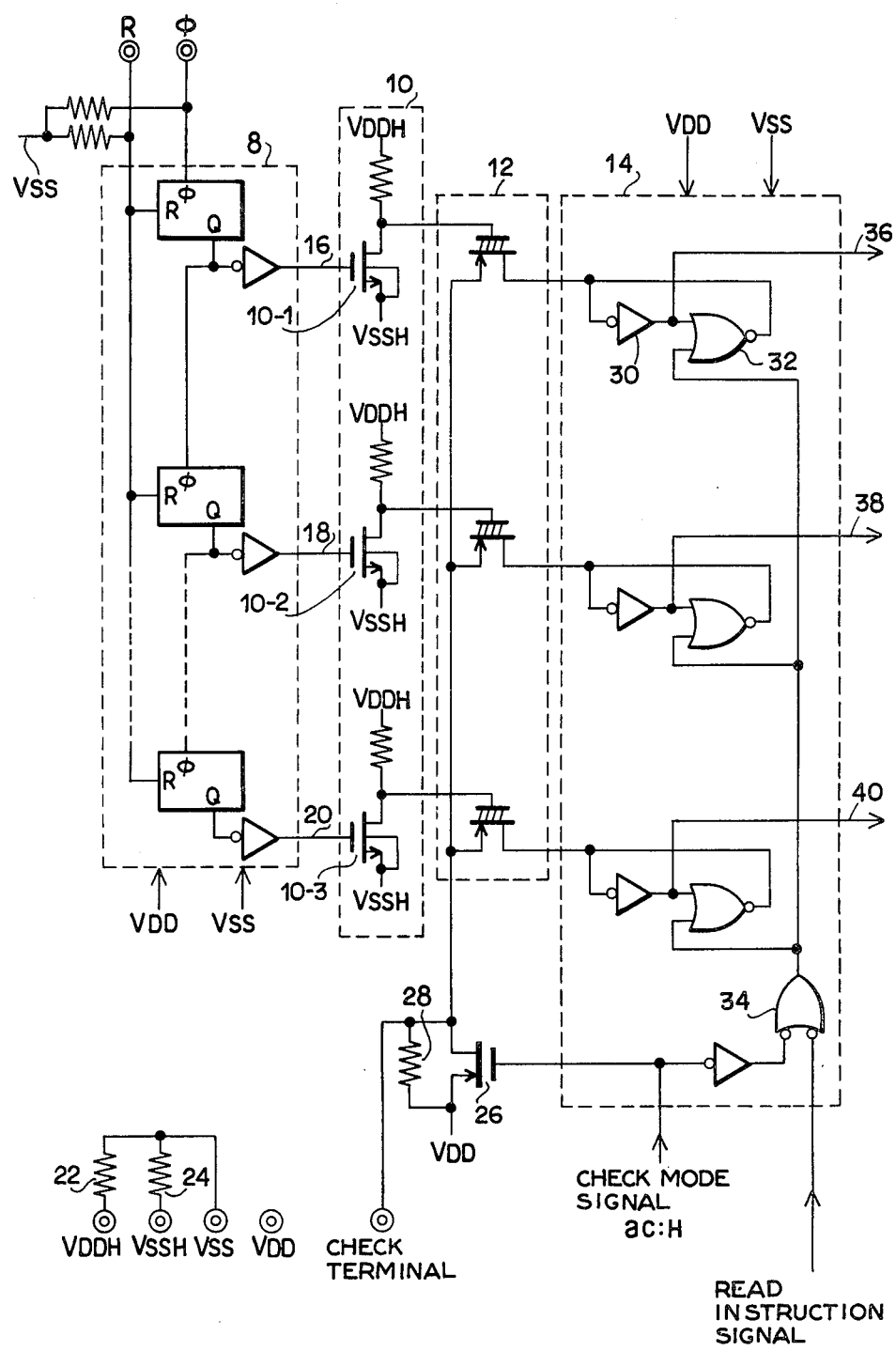
FIG. 3 is a diagram of a non-volatile memory circuit according to the embodiment of the present invention.

FIG. 3 is a diagram illustrating a non-volatile memory circuit according to an embodiment of the present invention having a volatile memory 8 which receives the data in a serial manner, a transistor group 10 having a high breakdown voltage which receives the data of the volatile memory 8, a non-volatile memory group 12 which receives the outputs of the transistor group 10, and a volatile memory 14 for reading the data of the non-volatile memory group.

The input volatile memory 8 is constructed in the form of a resettable counter with serially connected flip-flops. If the potential of a terminal R is set to the high level to reset the counter, and if a desired number of pulse signals are applied to a terminal $\phi$, the output terminals 16, 18 and 20 can be set to desired conditions.

The input volatile memory 8 is served with power supplies $V_{DD}$ and $V_{SS}$. Namely, the input volatile memory 8 is operated on the same power supplies as the electronic circuits of the portable electronic device such as electronic timepiece, and each output of the input volatile memory 8 corresponds to the signal S of FIG. 2.

Figure 4:
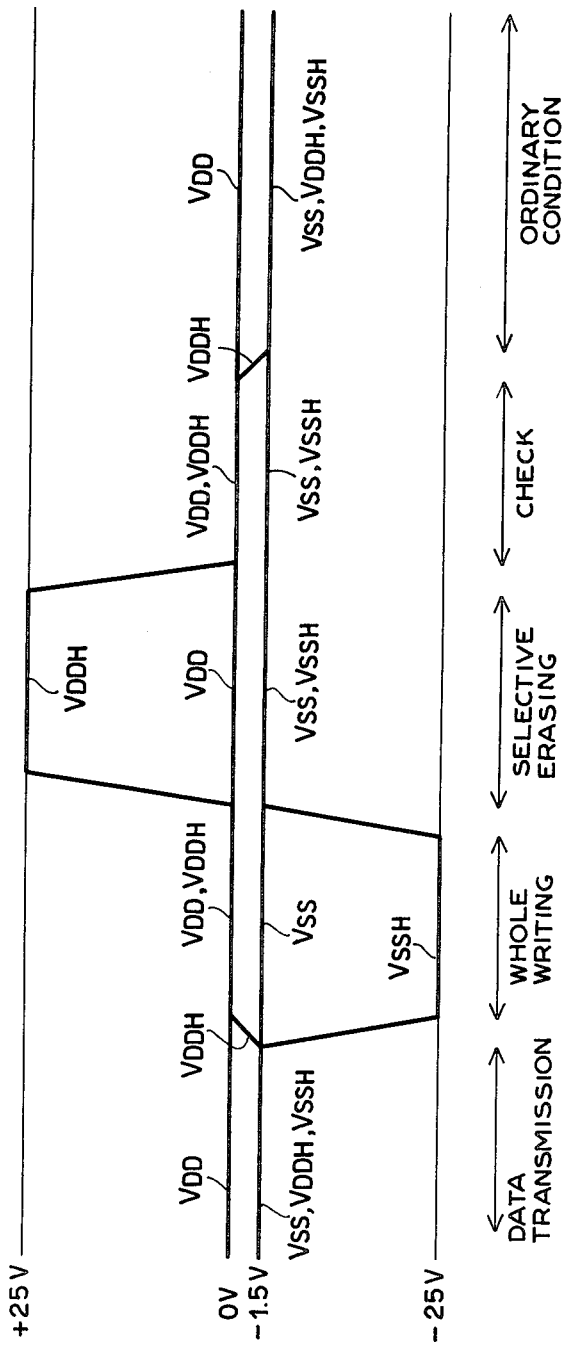
FIG. 4 is a diagram of waveforms for illustrating the power supply controlled by the memory circuit of FIG. 3.

Each transistor 10-1, 10-2 and 10-3 of group 10 having a high breakdown voltage is equivalent to the inverter of FIG. 2. After the data is stored in the input volatile memory 8, the transistor group 10 having high breakdown voltage receives high voltages $V_{DDH}$ and $V_{SSH}$, and selectively applies a high voltages to the gates of the MNOS non-volatile memory group 12 corresponding to the input data to thereby write or erase the data. The P$^-$-type substrate of the transistors having high breakdown voltage is separated from the P$^-$-type substrates of other blocks, and is connected to $V_{SSH}$. The potentials $V_{DDH}$ and $V_{SSH}$ during the writing and erasing are mentioned below with reference to FIG. 4.

$V_{DD}$ is set to zero volt, and $V_{SS}$ is set to $-1.5$ volts. In the period of "data transmission" in which the data is stored in the input volatile memory 8, the voltage of $-1.5$ V is applied to the terminals $V_{DDH}$ and $V_{SSH}$. Therefore, the contents of the non-volatile memory 12 are not changed during the period of "data transmission". In the next period of "whole writing", the voltage of zero volts is applied to the terminal $V_{DDH}$ and the voltage of $-25$ V is applied to the terminal $V_{SSH}$. Then, all of the transistors having high breakdown voltage in the group 10 are rendered conductive, whereby all of the outputs become $-25$ V, and the non-volatile memory group 12 assumes the writing condition.

The data is then selectively erased. In the period of "selective erasing", the voltage of $+25$ V is applied to the terminal $V_{DDH}$ and the voltage of $-1.5$ V is applied to the terminal $V_{SSH}$. Then, the transistors having high breakdown voltage in the group 10 are selectively rendered conductive responsive to the output of the input volatile memory 8, and the outputs of the transistor group 10 having high breakdown voltage are selectively changed from $+25$ V to $-1.5$ V, so that the non-volatile memory 12 is selectively erased. Then, the data written in the non-volatile memory 12 is checked. During the period of "checking", the voltage of zero volt is applied to the terminal $V_{DDH}$ and the voltage of $-1.5$ volts is applied to the terminal $V_{SSH}$. During subsequent "ordinary condition" when the portable electronic device is in use; the terminals $V_{DDH}$ and $V_{SSH}$ are opened and are served with $-1.5$ V through resistors 22 and 24. Under this condition, neither the inverter group in the transistor group 10 having high breakdown voltage nor the resistors 22, 24 consume electric power.

The non-volatile memory group 12 has source electrodes that are connected in common; the commonly connected source electrodes are connected to the check terminal. The commonly connected source electrodes are further connected to $V_{DD}$ via a P-channel transistor 26 having a large mutual conductance gm and a high resistance 28.

The gate of the P-channel transistor 26 is served with a check mode signal which assumes the high level only during the checking period to render the P-channel transistor 26 non-conductive. In the absence of the high check mode signal, $V_{DD}$ is normally impressed to the source electrode of the non-volatile memory 12 through the P-channel transistor 26.

Memories having a ring-connected inverter 30 and a NOR gate 32 are provided to correspond to each of the bits of the non-volatile memory 12. A signal produced by a gate 34 is fed to another input of the NOR gate 32. The signal produced by the gate 34 assumes the high level when the reading instruction signal is of the low level or the check mode signal is of the high level. Under the "ordinary condition", the terminals $V_{DDH}$ and $V_{SSH}$ assume the voltage $-1.5$ V, and the gate voltage of the non-volatile memory group 12 assumes a value $-1.5$ V. Therefore, the non-volatile memory units in the writing condition assumes the OFF state, and the non-volatile memory units in the erasing condition assumes the ON state.

The resistances of the transistor 26 and the non-volatile memory group 12 while they are conductive are selected to be sufficiently smaller than the resistance of the NOR gate 32 while it is conductive so that during the "ordinary condition" the outputs 36, 38 and 40 of the reading volatile memory 14 assume the high level responsive to the reading instruction signal when the corresponding non-volatile memory units are under the writing condition, and assume the low level irrespective of the reading instruction signal when the corresponding non-volatile memory units are under the erasing condition. A variety of control operations are carried out by the outputs 36, 38 and 40.

During the "checking" period, the check mode signal assumes the high level. The check mode signal renders the transistor 26 non-conductive, whereby the source terminal and the check terminal of the non-volatile memory are connected to $V_{DD}$ through the high resistance 28, and the NOR gate 32 produces an output of the low level. Further, since the terminal $V_{DDH}$ assumes zero volt and the terminal $V_{SSH}$ assumes $-1.5$ V, the transistor group 10 having high breakdown voltage works as an inverter.

A required number of pulse signals are applied to the terminal $\phi$, so that a non-volatile memory that is to be checked assumes a gate voltage $-1.5$ V, and other non-volatile memories all assume a gate voltage of 0 volt; the non-volatile memories are all rendered non-conductive except the one that is to be checked.

When the memory to be checked is under the writing condition, it is in the non-conductive state and the check terminal assumes the potential $V_{DD}$. When the memory to be checked is under the erasing condition, it is in the conductive state and the voltage at the check terminal drops.

Thus, any required number of pulse signals are applied to the terminal $\phi$ to check the conditions of each of the bits of the non-volatile memory.

Figure 5:
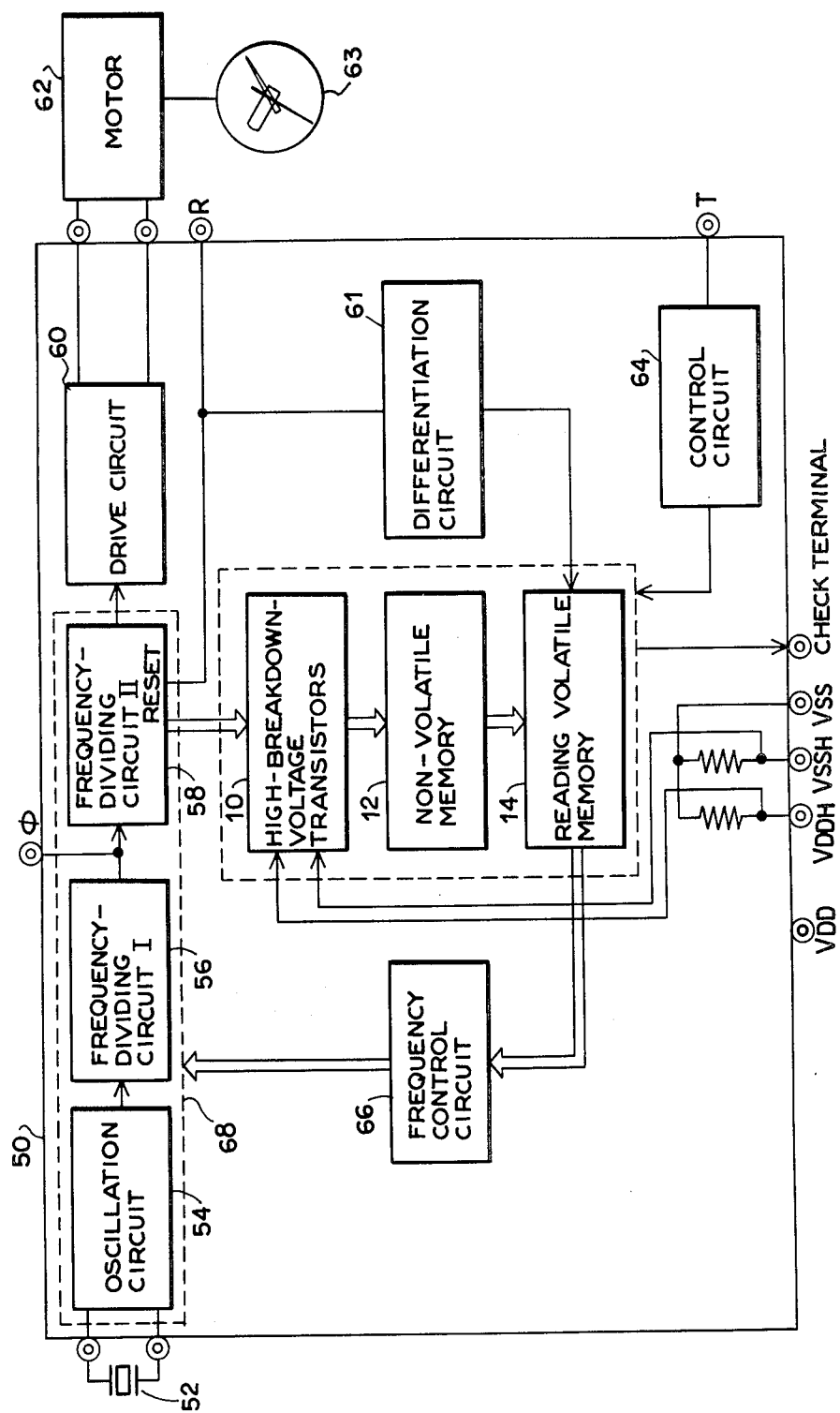
FIG. 5 is a block diagram when the non-volatile memory circuit of the present invention is employed for an electronic timepiece.

FIG. 5 is a block diagram of the embodiment when the non-volatile memory circuit according to the present invention is used for an electronic timepiece, in which a block 50 is formed on the same semiconductor substrate.

The frequency of oscillation signals of an oscillation circuit 54 using a quartz crystal 52 as a frequency control is divided by a frequency-dividing circuit I 56, and is further divided by a resettable frequency-dividing circuit II 58. A drive circuit 60 drives a motor 62 responsive to the output of the frequency-dividing circuit II 58, and the motor 62 actuates a time display device 63.

The frequency-dividing circuit II 58 works as the input volatile memory 8 which is shown in FIG. 3. The high-breakdown-voltage transistor 10, non-volatile memory 12, and reading volatile memory 14 are constructed in the same manner as the blocks that are denoted by the same reference numerals in FIG. 3. A signal which corresponds to the reading signal of FIG. 3 is produced by a differentiation circuit 61 which produces a signal that assumes the low level for a short period of time responsive to the operation of the reset terminal R. Alternatively, periodic signals produced by the frequency-dividing circuit II 58 may be used as the reading signals.

A signal which corresponds to the check mode signal of FIG. 3 is produced by a control circuit 64 responsive to a potential at a test terminal T.

The data stored in the non-volatile memory 12 is sent to a frequency control circuit 66, and an oscillating/frequency-dividing block 68 is controlled according to the data.

Figure 6:
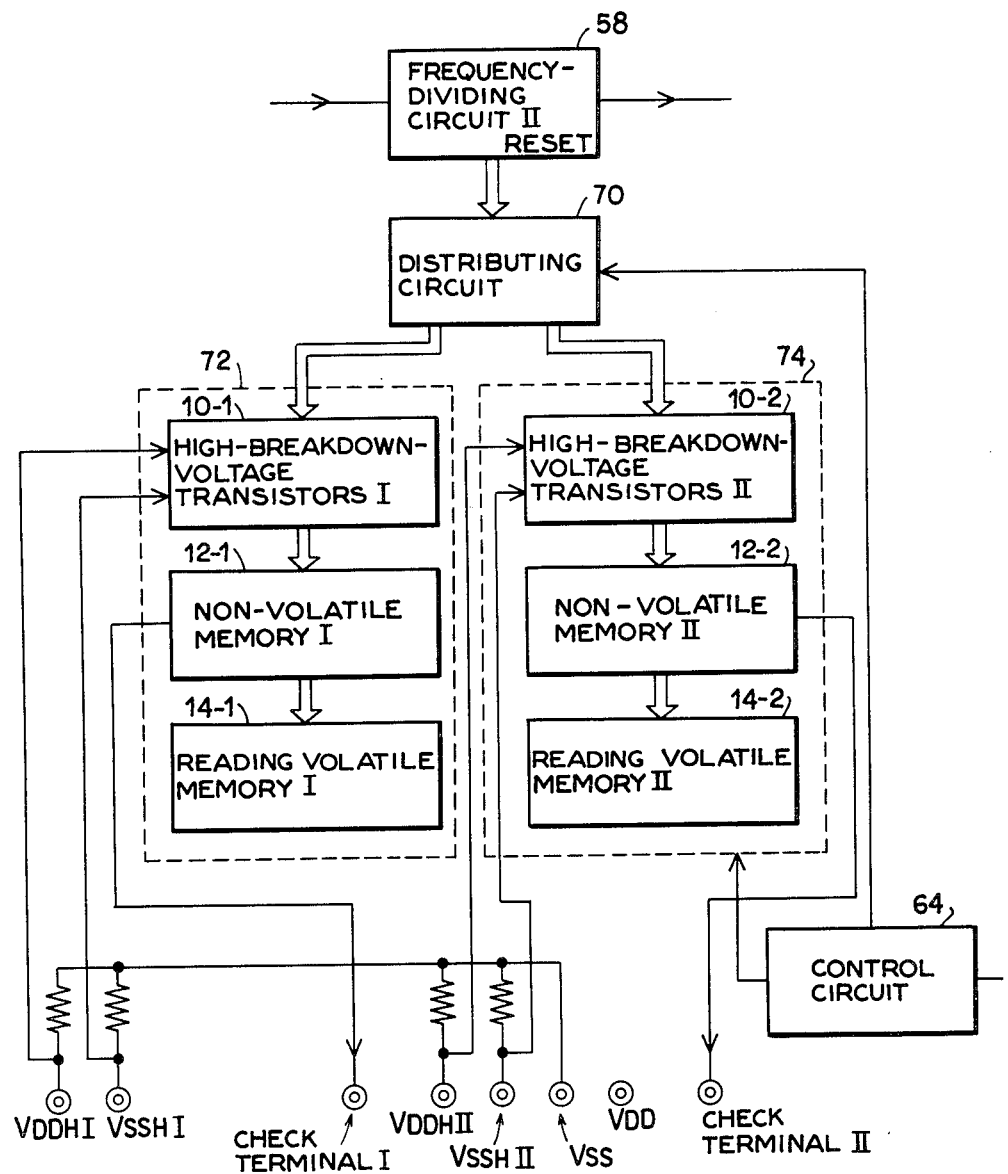
FIG. 6 is a block diagram illustrating another embodiment of FIG. 5.

FIG. 6 is a block diagram of a circuit which is used when the number of bits of the frequency-dividing circuit II is not sufficient relative to the number of bits of the non-volatile memory, and which is divided into a block 72 and a block 74 by a distributing circuit 70 to feed the data. When the circuit is thus constructed, it is necessary to provide the terminal $V_{DDH}$, terminal $V_{SSH}$ and check terminal for each of the blocks 72 and 74.

According to the present invention as will be obvious from the foregoing description, it is possible to realize a non-volatile memory circuit which consumes less electric power and which has reduced number of terminals.

As represented by a frequency-dividing circuit of timepieces, furthermore, a volatile memory which usually exhibits another function can be used for feeding the data to the non-volatile memory, in an attempt to reduce the number of circuit elements.

What is claimed is:

1. A writable non-volatile memory circuit used for portable electronic devices such as electronic timepieces, comprising
   a volatile memory including a plurality of stages with a corresponding plurality of outputs;
   said volatile memory also including a reset input for resetting the stages, a serial data input, and means for serially transferring data in the stages from serial input;
   a non-volatile memory including a plurality of non-volatile memory units; and
   writing means having a plurality of inputs connected to the respective outputs of the volatile memory and to the respective non-volatile units for writing the data from the outputs of the volatile memory into the corresponding non-volatile memory units;
   the volatile memory, the non-volatile memory and the writing means being formed on the same semiconductor substrate.

2. A circuit as claimed in claim 1 wherein the writing means includes a plurality of high-breakdown-voltage transistors having respective control electrodes defining the inputs of the writing means, and high-voltage terminal means connected to the high-breakdown-voltage transistors; said high-voltage-breakdown transistors being connected to the respective non-volatile memory units for selectively applying high writing voltages thereto in accordance with the volatile memory.

3. A circuit as claimed in claim 2 wherein each of the non-volatile memory units has a writing condition produced by a first high voltage, and has an erasing condition produced by a second high voltage opposite to the first high voltage; and the high voltage terminal means includes a first high voltage terminal for supplying the first high voltage to the high-breakdown-voltage transistors, and a second high voltage terminal for supplying the second high voltage to the high-breakdown-voltage transistors.

4. A circuit as claimed in claim 3 wherein each of the high-breakdown-voltage transistors is a FET with one of the source and drain sides thereof connected to the corresponding non-volatile memory unit; the writing circuit includes a plurality of load means connecting one of the first and second high voltage terminals to the one side of the respective FETs; and the other high voltage terminal is connected to the other sides of the FETs.

5. A circuit as claimed in claim 4 wherein the other high voltage terminal is adapted to be connected to the first high voltage to produce a writing condition in all of the plurality non-volatile memory units, and the one high voltage terminal is adapted to be connected to the second high voltage to produce erasing conditions in non-volatile memory units in accordance with data applied from the volatile memory means to the control electrodes of the FETs.

6. A circuit as claimed in claim 1 wherein the means for serially transferring data in the stages includes means interconnecting the stages in a binary counting arrangement.

7. A circuit as claimed in claim 1 wherein each of the stages comprises a flip-flop.

8. A circuit as claimed in claim 6 wherein each of the stages comprises a flip-flop.

9. A writable non-volatile memory circuit for an electronic timepiece having a oscillation circuit; a frequency dividing circuit with a plurality of stages, a reset input for resetting the stages, and a serial input connected to the output of the oscillation circuit and eans including time display means operated by the frequency dividing circuit for displaying time; the memory circuit comprising the frequency dividing circuit having the plurality of stages, a non-volatile memory including a plurality of non-volatile memory units, and writing means having a plurality of inputs connected to respective stages of the frequency dividing circuit and having a plurality of outputs connected to the respective non-volatile units for writing data from the stages of the frequency dividing circuit into the corresponding non-volatile memory units;

said frequency dividing circuit, said non-volatile memory, and said writing means being formed on the same semiconductor substrate.

10. A circuit as claimed in claim 9 wherein the writing means includes a plurality of high-breakdown-voltage transistors having respective control electrodes defining the inputs of the writing means, and a high-voltage terminal means connected to the high-breakdown-voltage transistors; said high-voltage-breakdown transistors being connected to the respective non-volatile memory units for selectively applying high writing voltages thereto in accordance with the frequency dividing circuit.

11. A circuit as claimed in claim 10 wherein each of the non-volatile memory units has a writing condition produced by a first high voltage, and has an erasing condition produced by a second high voltage opposite to the first high voltage; and the high voltage terminal means includes a first high voltage terminal for supplying the first high voltage to the high-breakdown voltage transistors, and a second high voltage terminal for supplying the second high voltage to the high-breakdown-voltage transistors.

12. A circuit as claimed in claim 11 wherein each of the high-breakdown-voltage transistors is a FET with one of the source and drain sides thereof connected to the corresponding non-volatile memory unit; the writing circuit includes a plurality of load means connecting one of the first and second high voltage terminals to the one side of the respective FETs; and the other high voltage terminal is connected to the other sides of the FETs.

13. A circuit as claimed in claim 12 wherein the other high voltage terminal is adapted to be connected to the first high voltage to produce a writing condition in all of the plurality non-volatile memory units, and the one high voltage terminal is adapted to be connected to the second high voltage to produce erasing conditions in non-volatile memory units in accordance with data applied from the frequency dividing circuit to the control electrodes of the FETs.

14. A electronic timepiece with a writable non-volatile memory circuit comprising a frequency circuit including an oscillation circuit, and a frequency dividing circuit with a plurality of stages, a reset input for resetting the stages, and a serial input connected to the output of the oscillation circuit;

means including time display means operated by the frequency dividing circuit for displaying time;

a non-volatile memory including a plurality of non-volatile memory units;

writing means having a plurality of inputs connected to respective stages of the frequency dividing circuit and having a plurality of outputs connected to the respective non-volatile units for writing data from the stages of the frequency dividing circuit into the corresponding non-volatile memory units; and frequency control means responsive to the volatile memory for controlling the frequency circuit;

said frequency dividing circuit, said non-volatile memory, and said writing means being formed on the same semiconductor substrate.

15. A timing device as claimed in claim 18 wherein the writing means includes a plurality of high-breakdown-voltage transistors having respective control electrodes defining the inputs of the writing means, and a high-voltage terminal means connected to the high-breakdown-voltage transistors; said high-voltage-breakdown transistors being connected to the respective non-volatile memory units for selectively applying high writing voltages thereto in accordance with the frequency dividing circuit.

16. A circuit as claimed in claim 15 wherein each of the non-volatile memory units has a writing condition produced by a first high voltage, and has an erasing condition produced by a second high voltage opposite to the first high voltage terminal means includes a first high voltage terminal for supplying the first high voltage to the high-breakdown-voltage transistors, and a second high voltage terminal for supplying the second high voltage to the high-breakdown-voltage transistors.

17. A circuit as claimed in claim 16 wherein each of the high-breakdown-voltage transistors is a FET with one of the source and drain sides thereof connected to the corresponding non-volatile memory unit; the writing circuit includes a plurality of load means connecting one of the first and second high voltage terminals to the one side of the respective FETs; and the other high voltage terminal is connected to the other sides of the FETs.

18. A circuit as claimed in claim 17 wherein the other high voltage terminal is adapted to be connected to the first high voltage to produce a writing condition in all of the plurality non-volatile memory units, and the one high voltage terminal is adapted to be connected to the second high voltage to produce erasing conditions in non-volatile memory units in accordance with data applied from the frequency dividing circuit to the control electrodes of the FETs.

* * * * *

UNITED STATES PATENT AND TRADEMARK OFFICE
CERTIFICATE OF CORRECTION

PATENT NO. : 4,475,180
DATED : October 2, 1984
INVENTOR(S) : Fukuo Sekiya and Itsunari Hayabuchi It is certified that error appears in the above-identified patent and that said Letters Patent is hereby corrected as shown below:

Column 8, line 24, the numeral "18" should read --14--.

Signed and Sealed this

Fourth Day of June 1985

[SEAL]

Attest:

DONALD J. QUIGG

Attesting Officer     Acting Commissioner of Patents and Trademarks